United States Patent
Maruyama

(10) Patent No.: US 7,023,720 B2
(45) Date of Patent: *Apr. 4, 2006

(54) FERROELECTRIC MEMORY DEVICE

(75) Inventor: Akira Maruyama, Yokohama (JP)

(73) Assignee: Seiko Epson Corporation, Tokyo (JP)

( * ) Notice: Subject to any disclaimer, the term of this patent is extended or adjusted under 35 U.S.C. 154(b) by 134 days.

This patent is subject to a terminal disclaimer.

(21) Appl. No.: 10/747,523

(22) Filed: Dec. 30, 2003

(65) Prior Publication Data
US 2004/0213032 A1 Oct. 28, 2004

(30) Foreign Application Priority Data
Jan. 7, 2003 (JP) ............................. 2003-001386

(51) Int. Cl.
G11C 11/22 (2006.01)

(52) U.S. Cl. ...................... 365/145; 365/202; 365/228; 365/189.09

(58) Field of Classification Search ................ 365/145, 365/230.06, 228, 226, 189.09, 202
See application file for complete search history.

(56) References Cited

U.S. PATENT DOCUMENTS 6,081,461 A * 6/2000 Shirley et al. .............. 365/190
6,788,564 B1 * 9/2004 Hamada ..................... 365/145
6,862,236 B1 * 3/2005 Maruyama ................. 365/202

FOREIGN PATENT DOCUMENTS

| JP | 07-106450 | 4/1995 |
|---|---|---|
| JP | 07-235648 | 9/1995 |
| JP | A 9-116107 | 5/1997 |

OTHER PUBLICATIONS

U.S. Appl. 10/393,439, filed Mar. 20, 2003, Yamamura.
U.S. Appl. 10/747,395, filed Dec. 30, 2003, Maruyama.
U.S. Appl. 10/737,959, filed Dec. 18, 2003, Maruyama.
U.S. Appl. 10/752,184, filed Jan. 7, 2004, Maruyama.
U.S. Appl. 10/754,691, filed Jan. 12, 2004, Maruyama.
U.S. Appl. 10/758,179, filed Jan. 16, 2004, Maruyama.

* cited by examiner

Primary Examiner—Richard Elms
Assistant Examiner—Toan Le
(74) Attorney, Agent, or Firm—Oliff & Berridge, PLC

(57) ABSTRACT

A ferroelectric memory device having a function of preventing destruction of data stored in an unselected memory cell. The ferroelectric memory device includes a protection circuit for protecting data in the unselected memory cell. The protection circuit is provided on an unselected-bitline-voltage supply line and an unselected-wordline-voltage supply line.

12 Claims, 9 Drawing Sheets

FERROELECTRIC MEMORY DEVICE

Japanese Patent Application No. 2003-1386, filed on Jan. 7, 2003, is hereby incorporated by reference in its entirety.

BACKGROUND OF THE INVENTION

The present invention relates to a ferroelectric memory device.

As a ferroelectric memory device, an active ferroelectric memory device including 1T/1C cells in which one transistor and one ferroelectric capacitor are disposed in each memory cell, or including 2T/2C cells in which a reference cell is further disposed in each memory cell, has been known.

However, since the active ferroelectric memory device has a large memory area in comparison with a flash memory or EEPROM which is known as a nonvolatile memory device in which a memory cell is formed by one element, the capacity cannot be increased.

As a nonvolatile memory device which is more suitably increased in capacity, a ferroelectric memory device in which each memory cell is formed by one ferroelectric capacitor has been proposed (see Japanese Patent Application Laid-open No. 9-116107).

In the ferroelectric memory device in which each memory cell is formed by one ferroelectric capacitor, since each memory cell does not include a switching transistor, a voltage which is not expected in the design stage may be applied. In particular, disturbance occurs if an overvoltage is repeatedly applied to unselected memory cells. In the worst situation, data is reversed.

BRIEF SUMMARY OF THE INVENTION

The present invention may provide a ferroelectric memory device capable of protecting the data in the unselected memory cell.

According to the present invention, there is provided a ferroelectric memory device comprising:

a plurality of wordlines disposed in parallel;

a plurality of bitlines disposed in parallel so as to intersect the wordlines;

a plurality of ferroelectric memory cells respectively disposed at intersections between the wordlines and the bitlines;

a wordline driver section which drives the wordlines;

a bitline driver section which drives the bitlines;

a power supply circuit which generates two or more types of voltages;

a plurality of voltage supply lines which supply the two or more types of voltages to the wordline driver section and the bitline driver section, from the power supply circuit; and a protection circuit which is provided on the voltage supply lines and protects an unselected memory cell in the ferroelectric memory cells from an overvoltage exceeding a predetermined voltage.

In the present invention, the unselected memory cell in the ferroelectric memory cells is protected by the protection circuit provided on the voltage supply lines so that the overvoltage exceeding the predetermined voltage is not applied to the unselected memory cell. Therefore, deterioration or reversal of data stored in the unselected memory cell can be prevented.

In this ferroelectric memory device, the ferroelectric memory cells may be driven by applying a selected voltage to a selected memory cell in the ferroelectric memory cells and applying an unselected voltage to the unselected memory cell. In this case, the protection circuit may protect the unselected memory cell from an overvoltage exceeding the unselected voltage. Specifically, a designed unselected voltage can always be applied to the unselected memory cell.

The ferroelectric memory device may further comprise: a voltage select circuit which selectively outputs the plurality of types of voltages generated by: the power supply circuit to the wordline driver section and the bitline driver section; a plurality of wordline-voltage supply lines which connect the voltage select circuit to the wordline driver section; and a plurality of bitline-voltage supply lines which connect the voltage select circuit to the bitline driver section. In this case, the protection circuit may include at least one short circuit which short-circuits at least one of the wordline-voltage supply lines and at least one of the bitline-voltage supply lines.

The potential difference between at least one of the wordline-voltage supply lines and at least one of the bitline-voltage supply lines goes toward 0 by short-circuiting these voltage supply lines, whereby application of the overvoltage to the unselected memory cell can be prevented.

The short circuit may perform a short-circuit operation when a potential difference between at least one of the wordline-voltage supply lines and at least one of the bitline-voltage supply lines exceeds the predetermined voltage, and stop the short-circuit operation when the potential difference is equal to or less than the predetermined voltage.

As a representative example of the short circuit, a forward-connected first diode and a reverse-connected second diode which are connected between at least one of the wordline-voltage supply lines and at least one of the bitline-voltage supply lines can be given. Specifically, the first and second diodes are connected in parallel in opposite directions. Although the potentials of the two voltage supply lines are changed, one of the two parallel-connected diodes is forward-connected, and the other is reverse-connected in any case.

A current does not flow through the forward-connected first diode until a forward bias voltage (corresponds to a diffusion potential or a built-in potential in the case of a PN junction) is applied. In this case, the above-described overvoltage (such as a voltage exceeding the unselected voltage) is the forward bias voltage of the first diode. The short circuit performs the short-circuit operation only when a forward voltage flowing through one of the first and second diodes exceeds that overvoltage. A current does not flow if the forward voltage is lower than the overvoltage. A current does not flow through the forward-connected first diode and the reverse-connected second diode during the normal operation in which the above overvoltage is not applied. Therefore, the short-circuit operation is not performed.

Each of the first and second diodes may be formed of a diode-connected transistor. In this case, the threshold voltage of the transistor corresponds to the above overvoltage. If the potential difference between at least one of the wordline-voltage supply lines and at least one of the bitline-voltage supply lines exceeds the threshold voltage, the diode-connected transistor performs the short-circuit operation.

The wordline-voltage supply lines may include a selected-wordline-voltage supply line and an unselected-wordline-voltage supply line; and the bitline-voltage supply lines may include a selected-bitline-voltage supply line and an unselected-bitline-voltage supply line. In this case, the short circuit may short-circuit at least one of the unselectedwordline-voltage supply line and the unselected-bitline-voltage supply line with one of the other voltage supply lines. This is because a voltage is applied to the unselected memory cell always through at least one of the unselected-wordline-voltage supply line and the unselected-bitline-voltage supply line and another voltage supply line.

The short circuit may be connected to the unselected-wordline-voltage supply line and the unselected-bitline-voltage supply line.

In comparison with at least one memory cell selected from among the ferroelectric memory cells disposed in matrix, unselected memory cells to which a voltages is applied through the unselected-wordline-voltage supply line and the unselected-bitline-voltage supply line are much larger in number.

Specifically, the load connected to the unselected-wordline-voltage supply line and the unselected-bitline-voltage supply line is considerably increased in comparison with the load connected to the other lines. In this case, the charge/discharge speed of the wordline and the bitline is decreased as the amount of the load increased, whereby the potential difference between the wordline and the bitline connected to the unselected memory cell may become an unexpected overvoltage exceeding the designed value during charging/discharging.

According to the above configuration, when an overvoltage is generated between the unselected-wordline-voltage supply line and the unselected-bitline-voltage supply line to which a large load is connected during charging/discharging of these supply lines, the short circuit operates and the potential difference goes toward 0. The data in the unselected memory cells is thus protected.

The short circuit may have a first short circuit connected to the selected-wordline-voltage supply line and the unselected-bitline-voltage supply line, and a second short circuit connected to the unselected-wordline-voltage supply line and the selected-bitline-voltage supply line.

This makes it unnecessary to provide a time difference between rise and fall timing of the potentials of the voltage supply lines, or enables the time difference to be reduced, whereby the read/write speed of the ferroelectric memory device can be increased. Even if the overvoltage occurs between the two voltage supply lines due to time delay which occurs between the rise/fall timing of the potentials of the voltage supply lines, either the first short circuit or the second short circuit short-circuits, whereby the unselected memory cell can be protected.

DETAILED DESCRIPTION OF THE EMBODIMENTS

Embodiments of the present invention are described below with reference to the drawings.

General Operation

Figure 1:
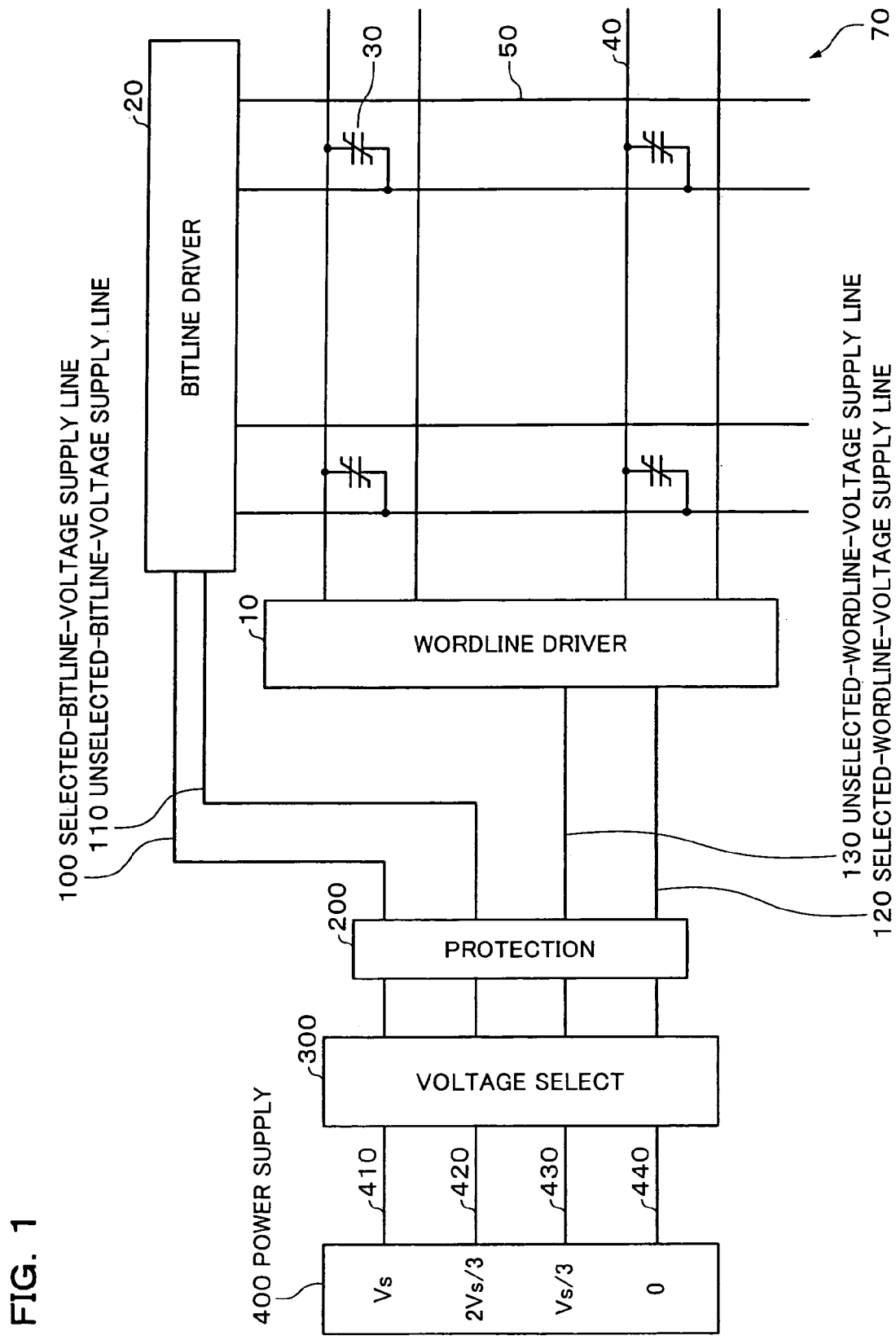
FIG. 1 is a block diagram showing a ferroelectric memory device according to first to third embodiments of the present invention.

A basic operation of a ferroelectric memory device is described below. FIG. 1 shows a ferroelectric memory device according to the present invention.

In the ferroelectric memory device shown in FIG. 1, a plurality of ferroelectric capacitors (or memory cells) 30 are respectively disposed at intersections between a plurality of wordlines 40 and a plurality of bitlines 50 arranged in matrix. A specific memory cell 30 is selected from the memory cells 30 by selecting one wordline 40 and one bitline 50. The wordline 40 selected for selecting the memory cell 30 is defined as a selected wordline, and the bitline 50 selected for selecting the memory cell 30 is defined as a selected bitline. All the remaining wordlines 40 other than the selected wordline are defined as unselected wordlines, and all the remaining bitlines 50 other than the selected bitline are defined as unselected bitlines.

In a computer, one bit is considered as the amount of information capable of expressing two states. A ferroelectric memory device (hereinafter may be called "FeRAM") is a memory device which utilizes two states which appear in the hysteresis phenomenon of the ferroelectric capacitor 30 as one bit. The two states which appear in the hysteresis phenomenon indicate two polarization directions of the ferroelectric capacitor 30.

Figure 2:
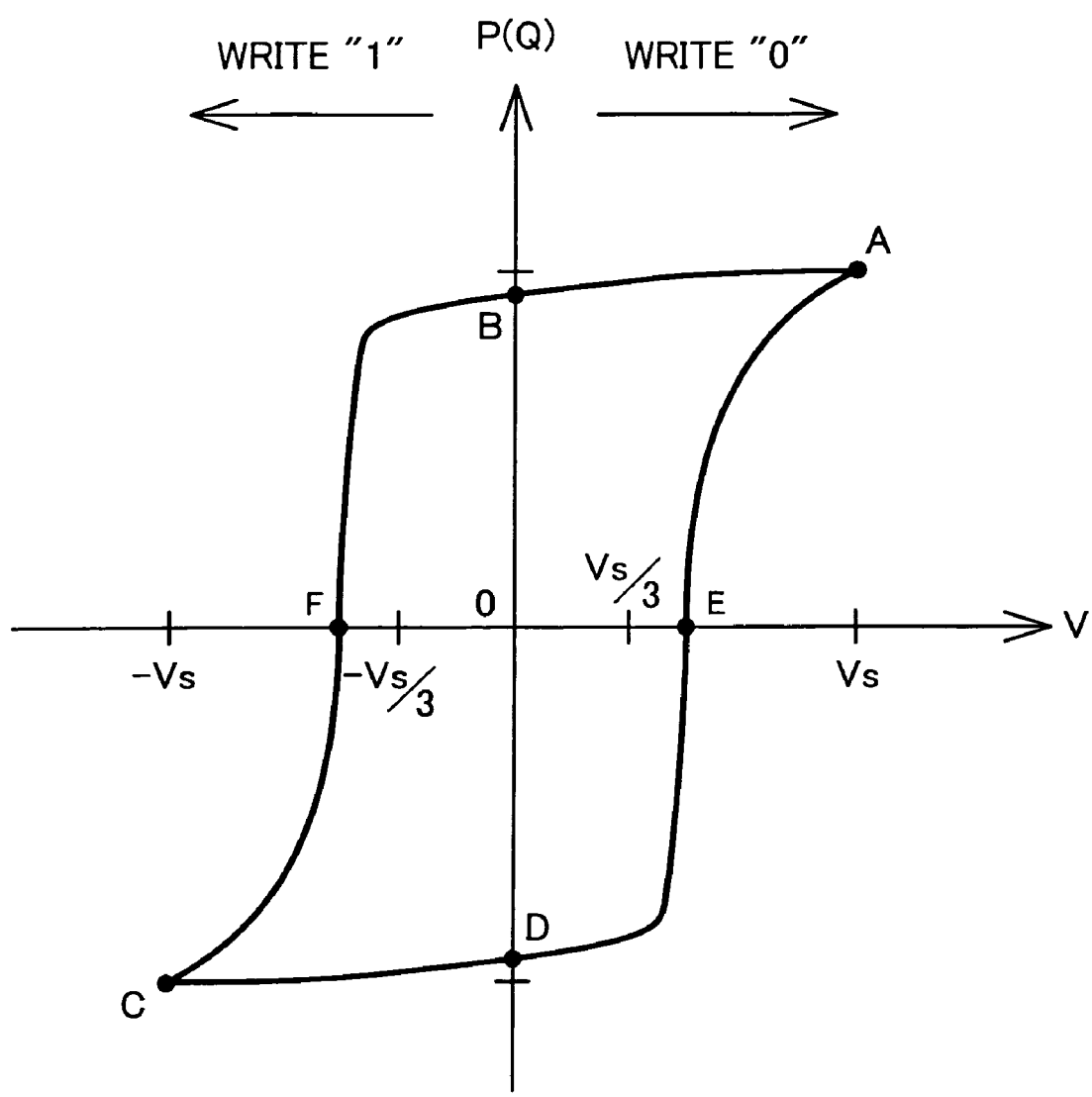
FIG. 2 is a graph showing a hysteresis phenomenon of a ferroelectric capacitor.

The hysteresis phenomenon is described below with reference to FIG. 2, which shows correlation between voltages applied to a ferroelectric and polarization values of the ferroelectric. In FIG. 2, the vertical axis P (Q) indicates the polarization (amount of charge) of the ferroelectric, and the horizontal axis V indicates the voltage applied to the ferroelectric. The hysteresis phenomenon is a phenomenon in which the polarization state of the ferroelectric capacitor 30 when a voltage equal to or higher than a specific voltage is applied to the ferroelectric capacitor 30 from the outside is retained even under conditions in which a voltage is not applied from the outside. The curve in FIG. 2 shows characteristics in which the polarization state of the ferroelectric capacitor 30 cycles corresponding to the change in the voltage applied to the ferroelectric capacitor 30. For example, a voltage Vs is applied to the ferroelectric capacitor 30 which is in a state at a point B. This causes the state to transition to a point A. When the applied voltage is changed to 0, the state returns to the point B. A voltage −Vs is then applied to the ferroelectric capacitor 30. This causes the state to transition to a point C. When the applied voltage is changed to 0, the state transitions to a point D. A voltage Vs/3 is then applied to the ferroelectric capacitor 30. When the applied voltage is changed to 0, the state returns to the point D. This means that the polarization of the ferroelectric capacitor 30 is not reversed. When the voltage Vs is then applied to the ferroelectric capacitor 30, the state transitions to the point A.

Specifically, in the case of applying a voltage to the ferroelectric capacitor 30, the polarization direction of the ferroelectric capacitor 30 after the application of the voltage differs depending on the value of the applied voltage.

A specific applied voltage is necessary to cause the polarization of the ferroelectric capacitor 30 to be reversed. The value of the necessary applied voltage differs depending on the ferroelectric material to be used. The absolute value of the applied voltage necessary to cause the polarization of the ferroelectric capacitor 30 to be reversed is defined as a polarization reversal voltage. The voltage application direction when the polarization of the ferroelectric capacitor 30 is reversed is defined as a polarization reversal application direction. The absolute value of the voltage applied to the ferroelectric capacitor 30 which is set at a value smaller than the absolute value of the coercive voltage, that is, set in the range which does not cause the polarization of the ferroelectric capacitor 30 to be reversed, is defined as an unselected voltage. Specifically, the voltage Vs/3 shown in FIG. 2 represents the unselected voltage. A point E and a point F shown in FIG. 2 are generally called the coercive voltages. The coercive voltage is the voltage applied to the ferroelectric at which the polarization becomes 0. Specifically, the coercive voltage is a value across which the polarization reversal occurs.

According to the above characteristics, the polarization directions (positive potential and negative potential) of the ferroelectric capacitor 30 can be respectively considered as "0" and "1". The voltage Vs is applied to the ferroelectric capacitor 30 in the case of storing "0", and the voltage –Vs is applied to the ferroelectric capacitor 30 in the case of storing "1". The characteristics which allow the polarization state to be retained even if external force is not applied can be connected with nonvolatility of a memory device.

Reading and writing of data of the ferroelectric memory device are described below.

Since the ferroelectric memory device in this example is a destructive read type ferroelectric memory device, a rewrite operation is necessary after read. Read and rewrite are necessary during reading, and writing of data "0" and writing of data "1" are necessary during writing. Since the application direction of the voltage must be reversed when writing data "0" and writing data "1" because of the characteristics of the ferroelectric capacitor 30, write requires a step of writing data "0" and a step of writing data "1". During reading, a state retained in the ferroelectric capacitor 30 is read from the amount of charge transfer in the ferroelectric capacitor 30 by applying a voltage in the same application direction as in the case of writing data "0".

As described above, the steps can be classified by the difference in the application direction of the voltage when reading data and writing data. Specifically, the steps can be classified into writing of data "0" and writing of data "1".

Reading of data may be expressed by writing of data "0" and writing of data "1" or writing of data "0" and writing of data "0". Therefore, writing of data "0" is defined as "read", and writing of data "1" is defined as "write".

The ferroelectric memory device is operated as a memory device by performing read/write of the memory cell 30 using the ferroelectric capacitor 30 by suitably controlling the applied voltage and the application direction.

First Embodiment

A first embodiment of the present invention is described below with reference to the drawings.

Description of Configuration

FIG. 1 is a block diagram showing a ferroelectric memory device according to the first embodiment.

In a memory cell array 70 shown in FIG. 1, a plurality of ferroelectric capacitors (or memory cells) 30 are disposed in an array. In more detail, a ferroelectric film is disposed at each of intersections-between the wordlines 50 and the bitlines 60. Therefore, the wordlines 50 and the bitlines 60 function as electrodes and the ferroelectric film is located between the electrodes, whereby the ferroelectric capacitors (memory cells) 30 are disposed at the intersections between the wordlines 50 and the bitlines 60. A voltage is supplied to the wordline 40 from a wordline driver section 10, and a voltage is supplied to the bitline 50 from a bitline driver section 20.

A voltage select circuit 300 selectively outputs a plurality of voltages (Vs, 2Vs/3, Vs/3, 0) generated by a power supply circuit 400 to the wordline driver section 10 or the bitline driver section 20 by a through one of a selected-bitline-voltage supply line 100, an unselected-bitline-voltage supply line 110, a selected-wordline-voltage supply line 120, and an unselected-wordline-voltage supply line 130.

The voltages selectively output by the voltage select circuit 300 are supplied to the wordline driver section 10 or the bitline driver section 20 through a protection circuit 200.

Figure 5:
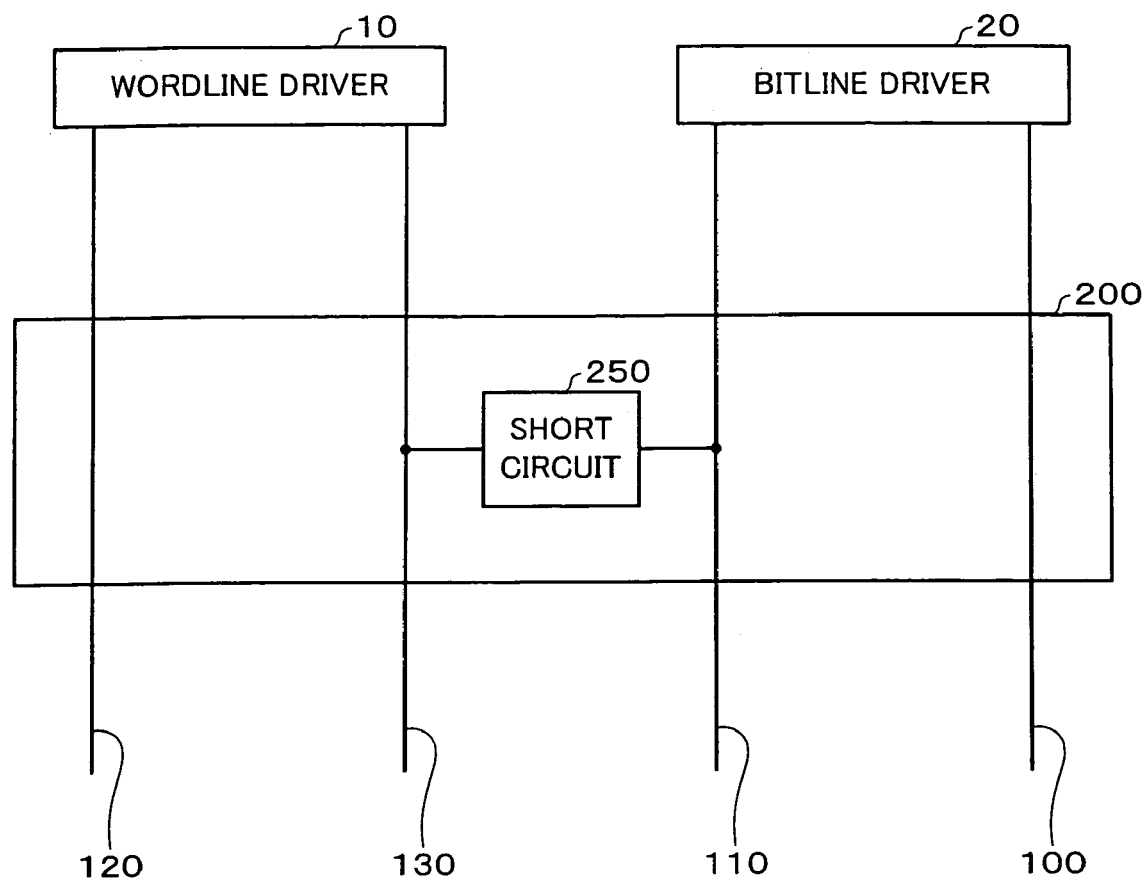
FIG. 5 is a block diagram showing a protection circuit according to the first and second embodiments of the present invention.

FIG. 5 is a block diagram showing the configuration of the protection circuit 200. The protection circuit 200 includes a short circuit 250. The short circuit 250 is connected with the unselected-bitline-voltage supply line 110 and the unselected-wordline-voltage supply line 130. The short circuit 250 includes a switch circuit 260 shown in FIG. 7.

Description of Operation

The operation in the first embodiment is described below. The voltages (Vs, 2Vs/3, Vs/3, 0) generated by the power supply circuit 400 shown in FIG. 1 are selectively output to the wordline driver section 10 and the bitline driver section 20 by the voltage select circuit 300. A voltage is applied to the ferroelectric capacitor (memory cell) 30 by utilizing the voltages supplied to the wordline driver section 10 and the bitline driver section 20.

Reading and writing of data include two steps consisting of read and write. Each of the read step and the write step is described below.

Read

Figure 3:
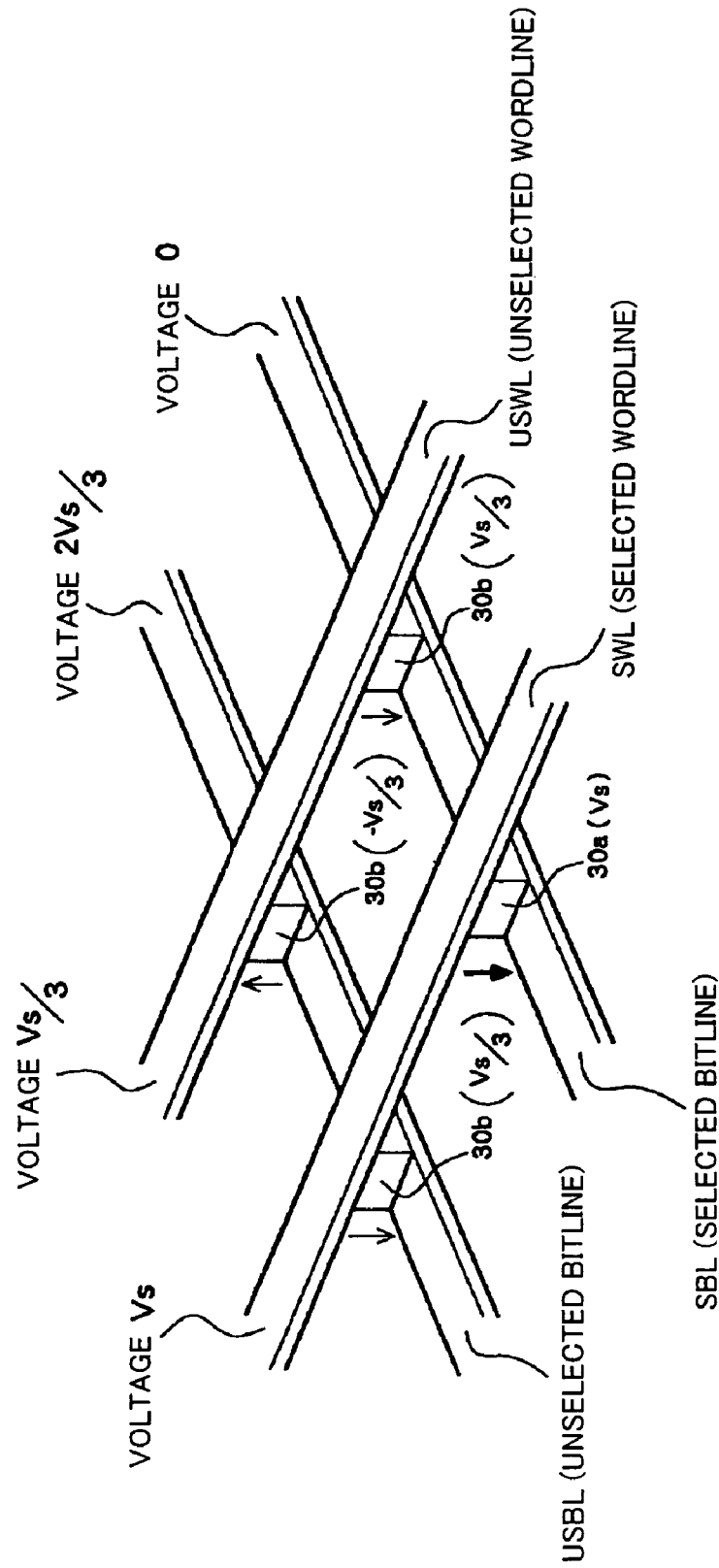
FIG. 3 shows voltages applied to a ferroelectric capacitor during a read operation.

FIG. 3 shows voltages applied during the read operation. A selected memory cell 30a shown in FIG. 3 is the memory cell 30 which is the target of read. In FIG. 3, a symbol SBL indicates a selected bitline, a symbol USBL indicates an unselected bitline, a symbol SWL indicates a selected wordline, and a symbol USWL indicates an unselected wordline. The voltages are supplied to the selected memory cell 30a from the selected-wordline-voltage supply line 120 and the selected-bitline-voltage supply line 100.

Unselected memory cells 30b shown in FIG. 3 indicate the remaining memory cells 30 which are not the target of read. The voltages from the unselected-wordline-voltage supply line 130 and the unselected-bitline-voltage supply line 110, the voltages from the selected-wordline-voltage supply line 120 and the unselected-bitline-voltage supply line 110, or the voltages from the unselected-wordlinevoltage supply line 130 and the selected-bitline-voltage supply line 100 are supplied to the unselected memory cell 30b.

The voltage select circuit 300 selectively outputs the voltages (Vs, 2Vs/3, Vs/3, 0) generated by the power supply circuit 400 to the voltage supply lines. The voltage select circuit 300 outputs the voltage Vs and the voltage Vs/3 to the wordline driver section 10, and outputs the voltage 0 and the voltage 2Vs/3 to the bitline driver section 20.

In more detail, the voltage select circuit 300 outputs the voltage Vs by using the selected-wordline-voltage supply line 120, outputs the voltage 2Vs/3 by using the unselected-bitline-voltage supply line 110, outputs the voltage Vs/3 by using the unselected-wordline-voltage supply line 130, and outputs the voltage 0 by using the selected-bitline-voltage supply line 100.

In the case of reading data from the selected memory cell 30a, the voltage Vs is output to the selected wordline SWL from the selected-wordline-voltage supply line 120, and the voltage 0 is output to the selected bitline SBL from the selected-bitline-voltage supply line 100. Therefore, the voltage Vs is applied to the selected memory cell 30a, whereby "0" is written through the point A shown in FIG. 2.

The voltage Vs/3, which is the voltage difference between the selected-wordline-voltage supply line 120 and the unselected-bitline-voltage supply line 110, is applied to the unselected memory cell 30b to which the voltages are supplied from the selected wordline SWL and the unselected bitline USBL. The voltage Vs/3, which is the voltage difference between the unselected-wordline-voltage supply line 130 and the selected-bitline-voltage supply line 100, is applied to the unselected memory cell 30b to which the voltages are supplied from the unselected wordline USWL and the selected bitline SBL. The voltage −Vs/3, which is the voltage difference between the unselected-wordline-voltage supply line 130 and the unselected-bitline-voltage supply line 110, is applied to the unselected memory cell 30b to which the voltages are supplied from the unselected wordline USWL and the unselected bitline USBL. The unselected memory cells 30b to which the voltages are supplied from the unselected wordline USWL and the unselected bitline USBL account for the majority of the memory cells 30 in the memory cell array 70.

In this embodiment, the absolute value of the voltage Vs/3 is set as the unselected voltage. Specifically, it is necessary to prevent a voltage which exceeds the absolute value of the unselected voltage from being supplied to the unselected memory cell 30b.

In this embodiment, the short circuit 250 is connected between the unselected-wordline-voltage supply line 130 and the unselected-bitline-voltage supply line 110 in order to achieve this object.

Figure 7:
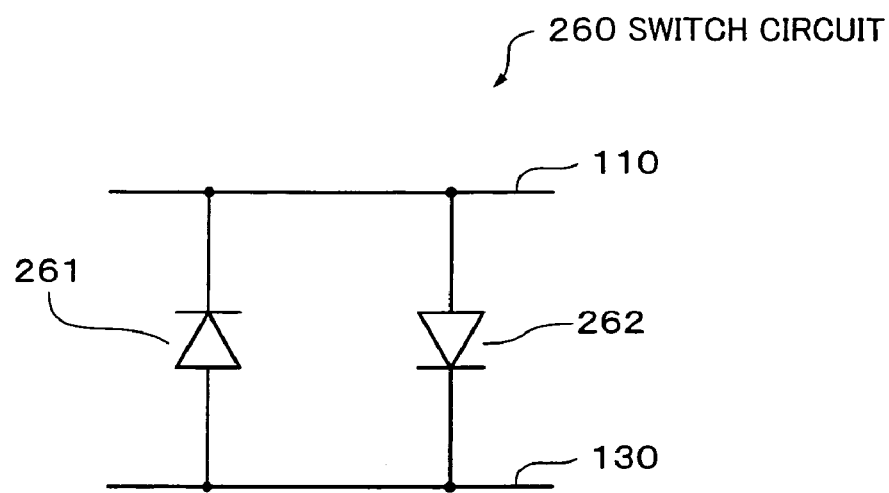
FIG. 7 is an equivalent circuit of a switch circuit according to the first and third embodiments of the present invention.

The short circuit 250 shown in FIG. 5 includes the switch circuit 260 shown in FIG. 7. The switch circuit 260 includes two diodes 261 and 262 which are connected in the forward direction and the reverse direction, for example. The switch circuit 260 is designed to perform the short-circuit operation when the voltage difference between the supply lines 110 and 130 exceeds the voltage Vs/3.

Specifically, the short circuit 250 performs the short-circuit operation when the voltage difference between the unselected-wordline-voltage supply line 130 and the unselected-bitline-voltage supply line 110 exceeds the voltage Vs/3, whereby the memory cells 30 to which the voltages are supplied from the unselected-wordline-voltage supply line 130 and the unselected-bitline-voltage supply line 110 can be protected from an overvoltage exceeding the unselected voltage.

The diodes 261 and 262 shown in FIG. 7 are connected in parallel in opposite directions. Although the potentials of the voltage supply lines 110 and 130 are changed, one of the two diodes 261 and 262 connected in parallel is forward-connected, and the other is reverse-connected in any case.

A current does not flow through the forward-connected diode determined by the potentials of the voltage supply lines 110 and 130 until a forward bias voltage which lowers the potential barrier at the PN junction is applied. The potential barrier at the PN junction is also called a diffusion potential or a built-in potential.

Figure 11:
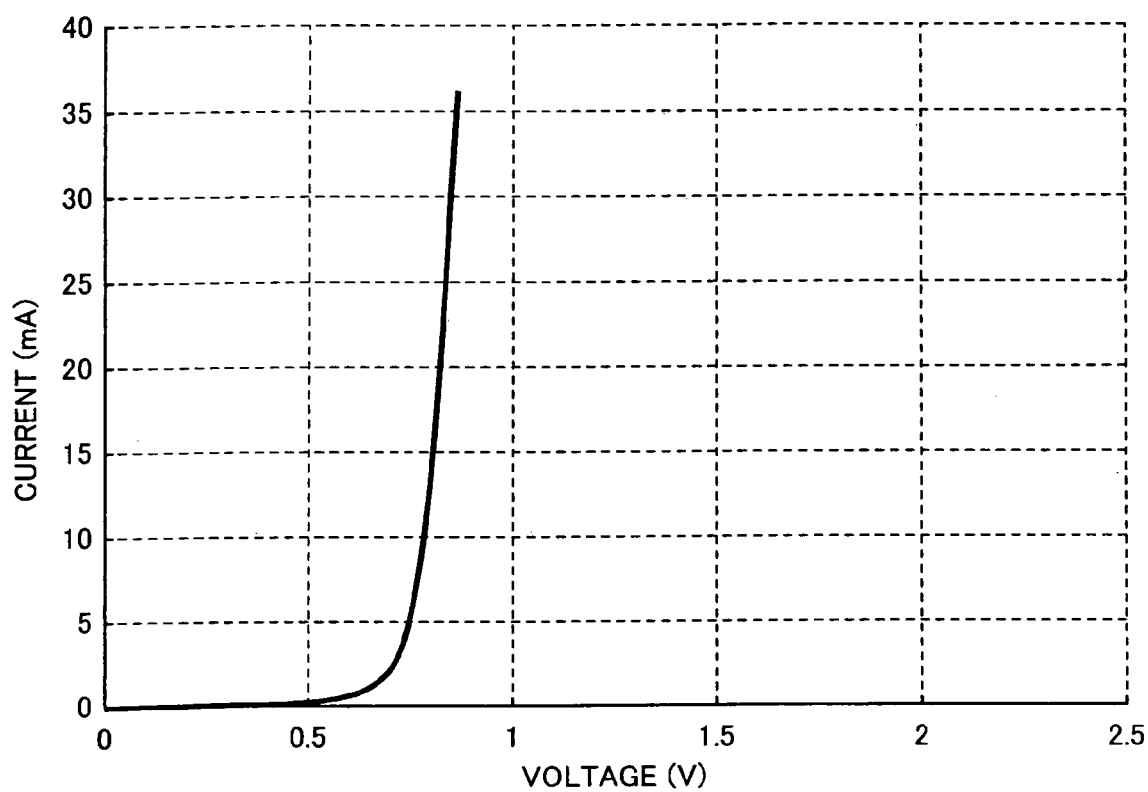
FIG. 11 is a graph showing voltage-current characteristics of a diode.

FIG. 11 shows voltage-current characteristics in the case of forming a PN diode by diffusing impurities into silicon. The diode shown in FIG. 11 has characteristics in which a current flows when the forward voltage exceeds about 0.6 V. The forward bias voltage is a voltage exceeding about 0.6 V.

In this embodiment, if the power supply voltage Vs is 1.8 V, the unselected voltage Vs/3 is 0.6 V. Therefore, if the diode having the characteristics shown in FIG. 11 is used, a current rapidly flows through the forward-connected diode when the potential difference between the voltage supply lines 110 and 130 exceeds the unselected voltage Vs/3 (=0.6V), whereby the voltage supply lines 110 and 130 are short-circuited. On the contrary, if the potential difference is equal to or less than the unselected voltage, a current does not flow through the forward-connected diode which is one of the diodes 261 and 262 and through the reverse-connected diode which is the other. Therefore, the short-circuit operation is not performed.

Write

Figure 4:
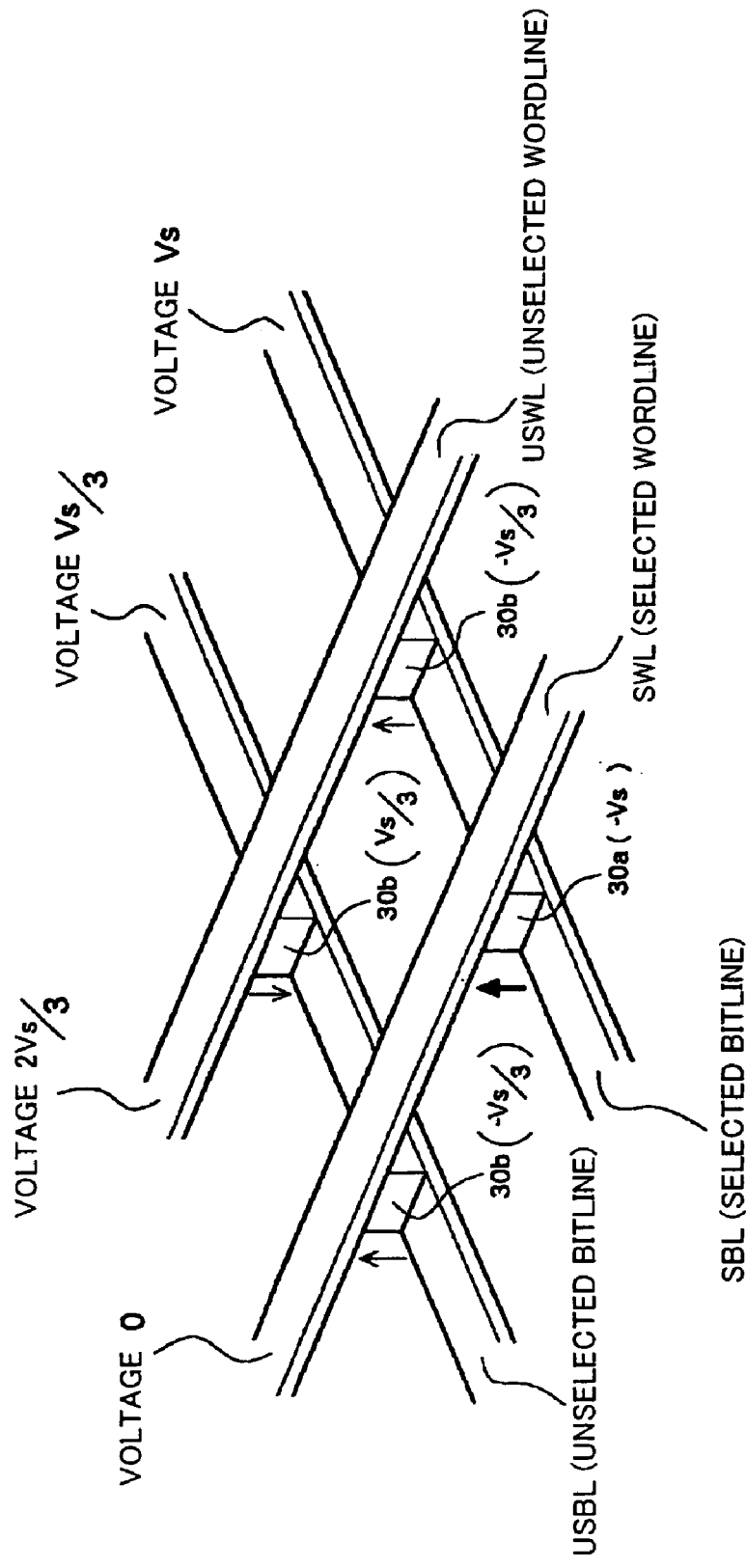
FIG. 4 shows voltages applied to a ferroelectric capacitor during a write operation.

FIG. 4 shows voltages applied during the write operation. A selected memory cell 30a shown in FIG. 4 is the memory cell 30 which is the target of write. Unselected memory cells 30b shown in FIG. 4 are the remaining memory cells 30 in which data is not written.

The difference between write and read is that the voltages selectively output by the voltage select circuit 300 are replaced between the wordline driver section 10 and the bitline driver section 20.

In more detail, the voltage select circuit 300 outputs the voltage Vs by using the selected-bitline-voltage supply line 100, outputs the voltage 2Vs/3 by using the unselected-wordline-voltage supply line 130, outputs the voltage Vs/3 by using the unselected-bitline-voltage supply line 110, and outputs the voltage 0 by using the selected-wordline-voltage supply line 120.

In the case of writing data in the selected memory cell 30a, the voltage 0 is output to the selected wordline SWL from the selected-wordline-voltage supply line 120, and the voltage Vs is output to the selected bitline SBL from the selected-bitline-voltage supply line 100. Therefore, the voltage −Vs is applied to the selected memory cell 30a, whereby "1" is written through the point C shown in FIG. 2.

The voltage application direction during writing is the reverse of the voltage application direction during reading. The voltage −Vs/3, which is the voltage difference between the selected-wordline-voltage supply line 120 and the unselected-bitline-voltage supply line 110, is applied to the unselected memory cell 30b to which the voltages are supplied from the selected wordline SWL and the unselected bitline USBL. The voltage −Vs/3, which is the voltage difference between the unselected-wordline-voltage supply line 130 and the selected-bitline-voltage supply line 100, is applied to the unselected memory cell 30b to which the voltages are supplied from the unselected wordline USWL and the selected bitline SBL. The voltage Vs/3, which is the voltage difference between the unselected-wordline-voltage supply line 130 and the unselected-bitline-voltage supply line 110, is applied to the unselected memory cell 30b to which the voltages are supplied from the unselected wordline USWL and the unselected bitline USBL.

The short circuit 250 performs the short-circuit operation when the absolute value of the voltage difference between the unselected-wordline-voltage supply line 130 and the unselected-bitline-voltage supply line 110 exceeds the unselected voltage in the same manner as during reading. This enables the memory cells 30 to which the voltages are supplied from the unselected-wordline-voltage supply line 130 and the unselected-bitline-voltage supply line 110 to be protected from the application of a voltage exceeding the unselected voltage. This embodiment is thus capable of achieving the object.

Second Embodiment

This embodiment differs from the first embodiment in the configuration of the short circuit 250. In this embodiment, the short circuit 250 shown in FIG. 5 is formed by using a switch circuit 270 shown in FIG. 8. The switch circuit 270 is formed by connecting two diode-connected transistors 271 and 272 between the voltage supply lines 110 and 130. The transistor 271 and 272 have substantially the same function as the diodes 261 and 262 shown in FIG. 7, which are connected in the forward direction and the reverse direction.

Third Embodiment

Description of Configuration

Figure 6:
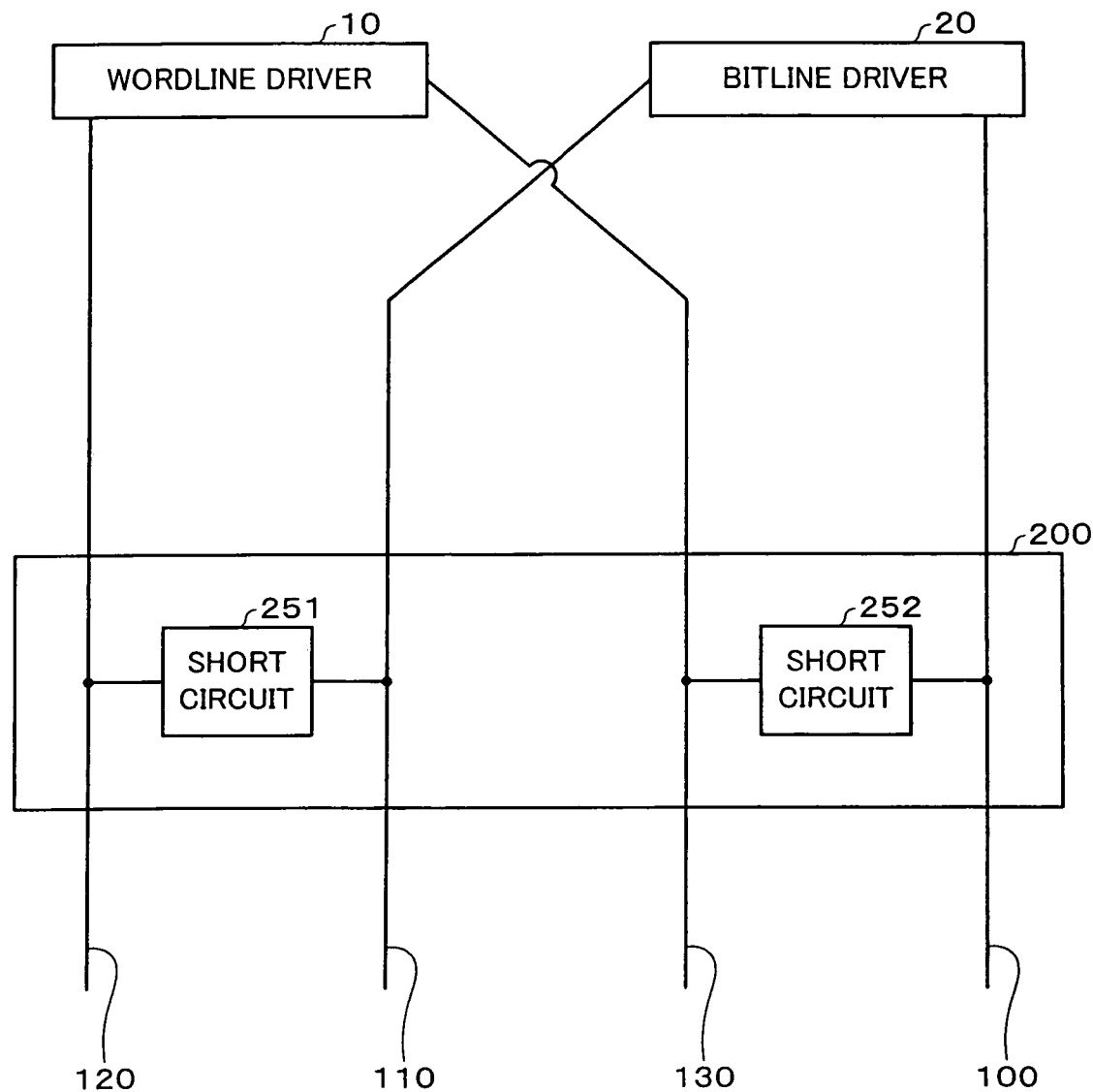
FIG. 6 is a block diagram showing a protection circuit according to the third embodiment of the present invention.

The protection circuit 200 of FIG. 1 has the configuration as shown in FIG. 6 in this embodiment. FIG. 6 is a block diagram showing the configuration of the protection circuit 200.

In this embodiment, the protection circuit 200 includes a short circuit 251 connected between the selected-wordline-voltage supply line 120 and the unselected-bitline-voltage supply line 110, and a short circuit 252 connected between the unselected-wordline-voltage supply line 130 and the selected-bitline-voltage supply line 100.

Each of the short circuits 251 and 252 is formed by using the switch circuit 260 shown in FIG. 7. The threshold value of the switch circuit 260 is set at the same value as the unselected voltage of the ferroelectric capacitor 30 used in this embodiment.

Description of Operation

The operation in this embodiment is described below. The voltages (Vs, 2Vs/3, Vs/3, 0) generated by the power supply circuit 400 shown in FIG. 1 are selectively output to the wordline driver section 10 or the bitline driver section 20 by the voltage select circuit 300 in the same manner as in the first embodiment.

This embodiment differs from the first embodiment in the internal configuration of the protection circuit 200 shown in FIG. 1.

The voltages are supplied to the wordline driver section 10 or the bitline driver section 20 from the voltage select circuit 300 by using the selected-wordline-voltage supply line 120, the unselected-bitline-voltage supply line 110, the selected-wordline-voltage supply line 120, and the unselected-wordline-voltage supply line 130. Since the protection circuit 200 is disposed on the selected-wordline-voltage supply line 120, the unselected-bitline-voltage supply line 110, the selected-wordline-voltage supply line 120, and the unselected-wordline-voltage supply line 130, the voltages supplied to the wordline driver section 10 or the bitline driver section 20 are controlled by the operation of the protection circuit 200.

FIG. 6 shows a specific internal configuration of the protection circuit 200. The short circuits 251 and 252 are respectively connected between the selected-wordline-voltage supply line 120 and the unselected-bitline-voltage supply line 110 and between the selected-bitline-voltage supply line 100 and the unselected-wordline-voltage supply line 130. The short circuit 251 or 252 short-circuits two supply lines connected with the short circuit 251 or 252 when a given condition is satisfied. In the block diagram of the protection circuit 200 shown in FIG. 6, the short circuit 251 short-circuits the selected-wordline-voltage supply line 120 and the unselected-bitline-voltage supply line 110, and the short circuit 252 short-circuits the selected-bitline-voltage supply line 100 and the unselected-wordline-voltage supply line 130.

The short circuit 251 or 252 includes the switch circuit 260 formed by the diodes 261 and 262 shown in FIG. 7. The threshold value of the switch circuit 260 is the same value as the unselected voltage of the ferroelectric capacitor 30 used in this embodiment.

In more detail, the short circuit 251 short-circuits the selected-wordline-voltage supply line 120 and the unselected-bitline-voltage supply line 110 when the voltage difference between the selected-wordline-voltage supply line 120 and the unselected-bitline-voltage supply line 110 exceeds the threshold value of the switch circuit in the short circuit 251.

The short circuit 252 short-circuits the selected-bitline-voltage supply line 100 and the unselected-wordline-voltage supply line 130 when the voltage difference between the selected-bitline-voltage supply line 100 and the unselected-wordline-voltage supply line 130 exceeds the threshold value of the switch circuit in the short circuit 252.

Effect of Third Embodiment

In this embodiment, the protection circuit 200 is operated as described above. The effect of the operation is described below.

Figure 9:
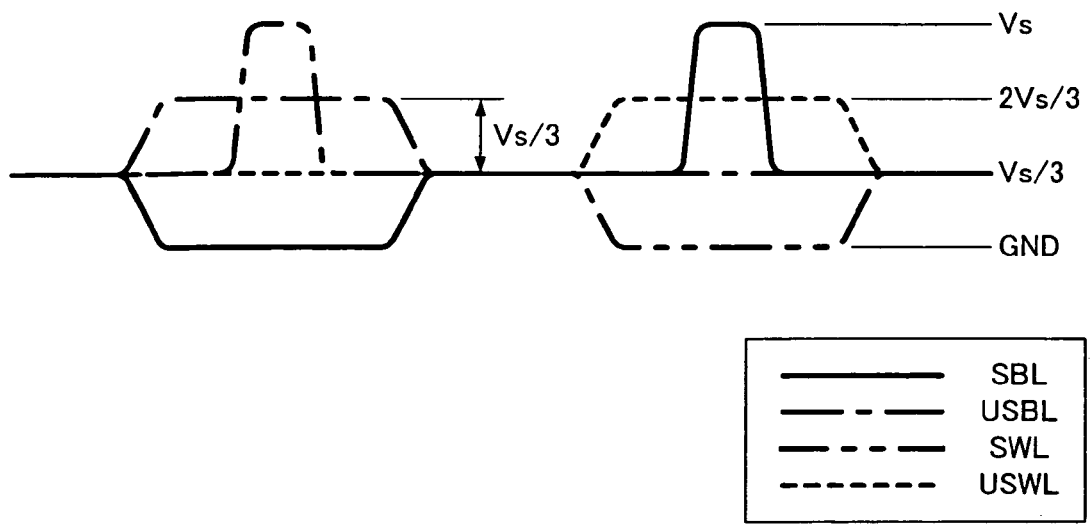
FIG. 9 is a waveform chart showing voltage variation according to a comparative example of the third embodiment of the present invention.

FIG. 9 is a waveform chart showing variation of voltages applied to the memory cells 30 for each of the selected bitline SBL, the unselected bitline USBL, the selected wordline SWL, and the unselected wordline USWL according to a method of a comparative example of the third embodiment. The waveform diagram on the left and the waveform diagram on the right are illustrated in time series, and respectively show the waveforms during reading and the waveforms during writing.

Figure 10:
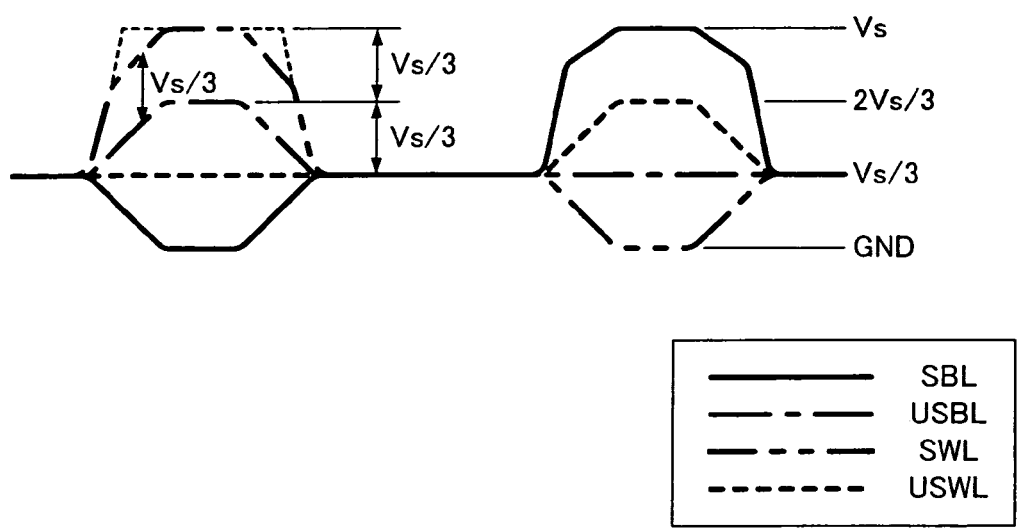
FIG. 10 is a waveform chart showing voltage variation according to the third embodiment of the present invention.

FIG. 10 is a waveform chart showing variation of voltages applied to the memory cells 30 for each of the selected bitline SBL, the unselected bitline USBL, the selected wordline SWL, and the unselected wordline USWL, according to this embodiment. The waveform diagram on the left and the waveform diagram on the right are illustrated in time series, and respectively show the waveforms during reading and the waveforms during writing.

As shown in FIG. 9, the rise timing of the waveform of the selected wordline SWL during reading is allowed to differ from the rise timing of the unselected bitline USBL, the unselected wordline USWL, and the selected bitline SBL.

The rise timing of the waveform of the selected bitline SBL during writing is allowed to differ from the rise timing of the unselected bitline USBL, the unselected wordline USWL, and the selected wordline SWL.

This is because the voltages cannot be accurately applied to the memory cells 30 if the voltages are applied to all the wordlines 40 and the bitlines 50 at the same time.

In more detail, in the case of applying the voltages to the selected wordline SWL and the unselected bitline USBL at the same time during reading, the voltage difference between the selected wordline SWL and the unselected bitline USBL exceeds Vs/3 due to the difference in rise gradient. This causes a voltage exceeding the unselected voltage to be applied to the memory cells 30 connected with the selected wordline SWL and the unselected bitline USBL, whereby an erroneous write may occur.

In the case of applying the voltages to the selected bitline SBL and the unselected wordline USWL at the same time during writing, the voltage difference between the selected bitline SBL and the unselected wordline USWL exceeds Vs/3 due to the difference in rise gradient. This causes a voltage exceeding the unselected voltage to be applied to the memory cells 30 connected with the selected bitline SBL and the unselected wordline USWL, whereby an erroneous write may occur.

The reason for occurrence of the above problem is that the interconnect capacity of the selected wordline SWL or the selected bitline SBL is significantly smaller than the interconnect capacity of the unselected wordline USWL or the unselected bitline USBL.

The method in the comparative example aims at preventing occurrence of the above problem by allowing the application timing to differ as shown in FIG. 9.

However, the method in the comparative example increases the access time, thereby preventing an increase in the access speed which is one of the demands required for the ferroelectric memory device.

According to this embodiment, the access time can be reduced by the protection circuit 200 without allowing the application timing to differ, or by reducing the time difference between the application timing. Moreover, application of an overvoltage exceeding the unselected voltage can be prevented.

As shown in FIG. 7, the voltages are applied to the selected wordline SWL and the unselected bitline USBL at the same time during reading. The difference in rise time occurs between the two voltages due to the difference in interconnect capacitance. However, since the voltage difference between the selected wordline SWL and the unselected bitline USBL is managed so as not to exceed the unselected voltage by using the short circuit 251 of the protection circuit 200, the waveforms are generated as shown in FIG. 10.

The voltages are applied to the selected bitline SBL and the unselected wordline USWL at the same time during writing. In this case, the difference in rise time occurs between the two voltages due to the difference in interconnect capacitance. However, since the voltage difference between the selected bitline SBL and the unselected wordline USWL is managed so as not to exceed the unselected voltage by using the short circuit 252 of the protection circuit 200, the waveforms are generated as shown in FIG. 10.

This enables the access time of the memory cell 30 to be reduced.

The present invention is not limited to the above-described embodiments. Various modifications and variations are possible within the spirit and scope of the present invention.

Figure 8:
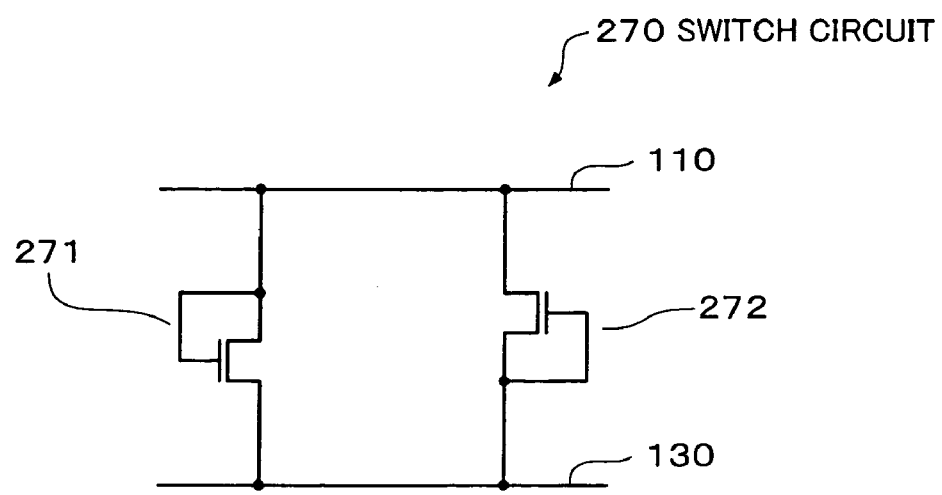
FIG. 8 is an equivalent circuit diagram of a switch circuit according to the second and third embodiments of the present invention.

In the third embodiment, the short circuits 251 and 252 shown in FIG. 6 may be formed by using the switch circuit 270 shown in FIG. 8, for example.

The value of the overvoltage at which the short-circuit operation is started may be appropriately set by changing the forward bias voltage of the diode. The forward bias voltage can be changed by changing the material for forming the PN junction or connecting a plurality of diodes in series.

What is claimed is:

1. A ferroelectric memory device comprising:
   a plurality of wordlines disposed in parallel;
   a plurality of bitlines disposed in parallel so as to intersect the wordlines;
   a plurality of ferroelectric memory cells respectively disposed at intersections between the wordlines and the bitlines;
   a wordline driver section which drives the wordlines;
   a bitline driver section which drives the bitlines;
   a power supply circuit which generates two or more types of voltages;
   a plurality of voltage supply lines which supply the two or more types of voltages to the wordline driver section and the bitline driver section, from the power supply circuit; and
   a protection circuit which is provided on the voltage supply lines and protects an unselected memory cell in the ferroelectric memory cells from an overvoltage exceeding a predetermined voltage.

2. The ferroelectric memory device as defined in claim 1, wherein:
   the ferroelectric memory cells are driven by applying a selected voltage to a selected memory cell in the ferroelectric memory cells and applying an unselected voltage to the unselected memory cell; and
   the protection circuit protects the unselected memory cell from an overvoltage exceeding the unselected voltage.

3. The ferroelectric memory device as defined in claim 1, further comprising:
   a voltage select circuit which selectively outputs the plurality of types of voltages generated by the power supply circuit to the wordline driver section and the bitline driver section;
   a plurality of wordline-voltage supply lines which connect the voltage select circuit to the wordline driver section; and
   a plurality of bitline-voltage supply lines which connect the voltage select circuit to the bitline driver section,
   wherein the protection circuit includes at least one short circuit which short-circuits at least one of the wordline-voltage supply lines and at least one of the bitline-voltage supply lines.

4. The ferroelectric memory device as defined in claim 3, wherein the short circuit performs a short-circuit operation when a potential difference between at least one of the wordline-voltage supply lines and at least one of the bitline-voltage supply lines exceeds the predetermined voltage, and stops the short-circuit operation when the potential difference is equal to or less than the predetermined voltage.

5. The ferroelectric memory device as defined in claim 4, wherein the short circuit includes a forward-connected first diode and a reverse-connected second diode provided between at least one of the wordline-voltage supply lines and at least one of the bitline-voltage supply lines.

6. The ferroelectric memory device as defined in claim 5, wherein each of the first and second diodes is formed of a diode-connected transistor.

7. The ferroelectric memory device as defined in claim 3, wherein:
   the wordline-voltage supply lines include a selected-wordline-voltage supply line and an unselected-wordline-voltage supply line;
   the bitline-voltage supply lines include a selected-bitline-voltage supply line and an unselected-bitline-voltage supply line; and
   the short circuit short-circuits at least one of the unselected-wordline-voltage supply line and the unselected-bitline-voltage supply line with one of the other voltage supply lines.

8. The ferroelectric memory device as defined in claim 7, wherein the short circuit is connected to the unselected-wordline-voltage supply line and the unselected-bitline-voltage supply line.

9. The ferroelectric memory device as defined in claim 7, wherein the short circuit has a first short circuit connected to the selected-wordline-voltage supply line and the unselected-bitline-voltage supply line, and a second short circuit connected to the unselected-wordline-voltage supply line and the selected-bitline-voltage supply line.

10. The ferroelectric memory device as defined in claim 9, wherein the wordline driver section and the bitline driver section simultaneously perform the voltage application from the selected-wordline-voltage supply line to the unselected memory cell and from the unselected-bitline-voltage supply line to the unselected memory cell.

11. The ferroelectric memory device as defined in claim 9, wherein the wordline driver section and the bitline driver section simultaneously perform the voltage application from the unselected-wordline-voltage supply line to the unselected memory cell and from the selected-bitline-voltage supply line to the unselected memory cell.

12. The ferroelectric memory device as defined in claim 9, wherein the wordline driver section and the bitline driver section simultaneously perform the voltage application from the selected-wordline-voltage supply line to the selected memory cell and from the selected-bitline-voltage supply line to the selected memory cell.

* * * * *